United States Patent [19]
Samek

[11] 4,289,384
[45] Sep. 15, 1981

[54] ELECTRODE STRUCTURES AND INTERCONNECTING SYSTEM

[75] Inventor: Norbert E. Samek, Sierra Madre, Calif.

[73] Assignee: Bell & Howell Company, Chicago, Ill.

[21] Appl. No.: 34,893

[22] Filed: Apr. 30, 1979

[51] Int. Cl.³ .......................... G02B 1/03; H05K 1/11; H05K 1/18
[52] U.S. Cl. ...................................... 350/392; 29/847; 174/68.5; 339/17 R
[58] Field of Search ................. 350/150, 336, 356, 96, 350/14; 310/366; 358/241; 361/416, 393, 395, 404, 425; 250/578; 365/231, 108–109, 215, 234–235; 340/166 FE, 783, 784, 752; 174/68.5; 339/17 R, 17 B, 17 L, 17 LC, 17 LM, 17 M, 17 N, 17 T; 29/846–847

[56] References Cited

U.S. PATENT DOCUMENTS

| | | | |
|---|---|---|---|
| 2,692,190 | 10/1954 | Pritikin | 339/17 B |
| 3,505,570 | 4/1970 | Sprude et al. | 174/68.5 |
| 3,531,581 | 9/1970 | Chesemore | 174/68.5 |
| 3,609,431 | 9/1971 | Lifschitz | 174/68.5 |
| 3,736,047 | 5/1973 | Gelber et al. | 350/164 |
| 3,873,187 | 3/1975 | Brooks | 350/356 |
| 3,998,513 | 12/1976 | Kobayashi et al. | 339/17 M |
| 4,012,117 | 3/1977 | Lazzery | 339/17 L |

FOREIGN PATENT DOCUMENTS

| | | | |
|---|---|---|---|
| 1208375 | 1/1966 | Fed. Rep. of Germany | 339/17 B |
| 2444539 | 4/1976 | Fed. Rep. of Germany | 339/17 LC |
| 943497 | 4/1963 | United Kingdom | 339/17 LC |
| 1534027 | 11/1978 | United Kingdom | 350/150 |

OTHER PUBLICATIONS

Meiboom, S. M., "Miniature Contacts for Pluggable Modules", IBM Tech. Disc. Bull., 10-1962, pp. 24–25, A Pressure Connection for Miniature Packaging.
Marshall et al., "Solder Bump Interconnected, Multiple Chip, Thick Film Hybrid for 40-Character Alphanumeric LCD Application", Solid State Tech., 1-1979 pp. 87–93.
Cutchen et al., "Electrooptic Devices Utilizing Quadratic PLZT Ceramic Elements", 1973 Wescon Tech. Papers, Sec. 30, pp. 30/2-1-12.

*Primary Examiner*—William H. Punter
*Attorney, Agent, or Firm*—Benoit Law Corporation

[57] ABSTRACT

Arrays of first and second electrodes extending in mutual registration on opposite faces of the same substrate to an edge portion thereof are mutually interconnected by a plurality of electrically conductive deposits extending across that edge portion. These conductive deposits are distributed along the edge portion in a pattern including a recurring deposit width smaller than the smallest spacing between any adjacent two electrodes of either of the first and second electrodes, alternating with a recurring deposit spacing smaller than the smallest width of any of the first and second electrodes.

31 Claims, 23 Drawing Figures

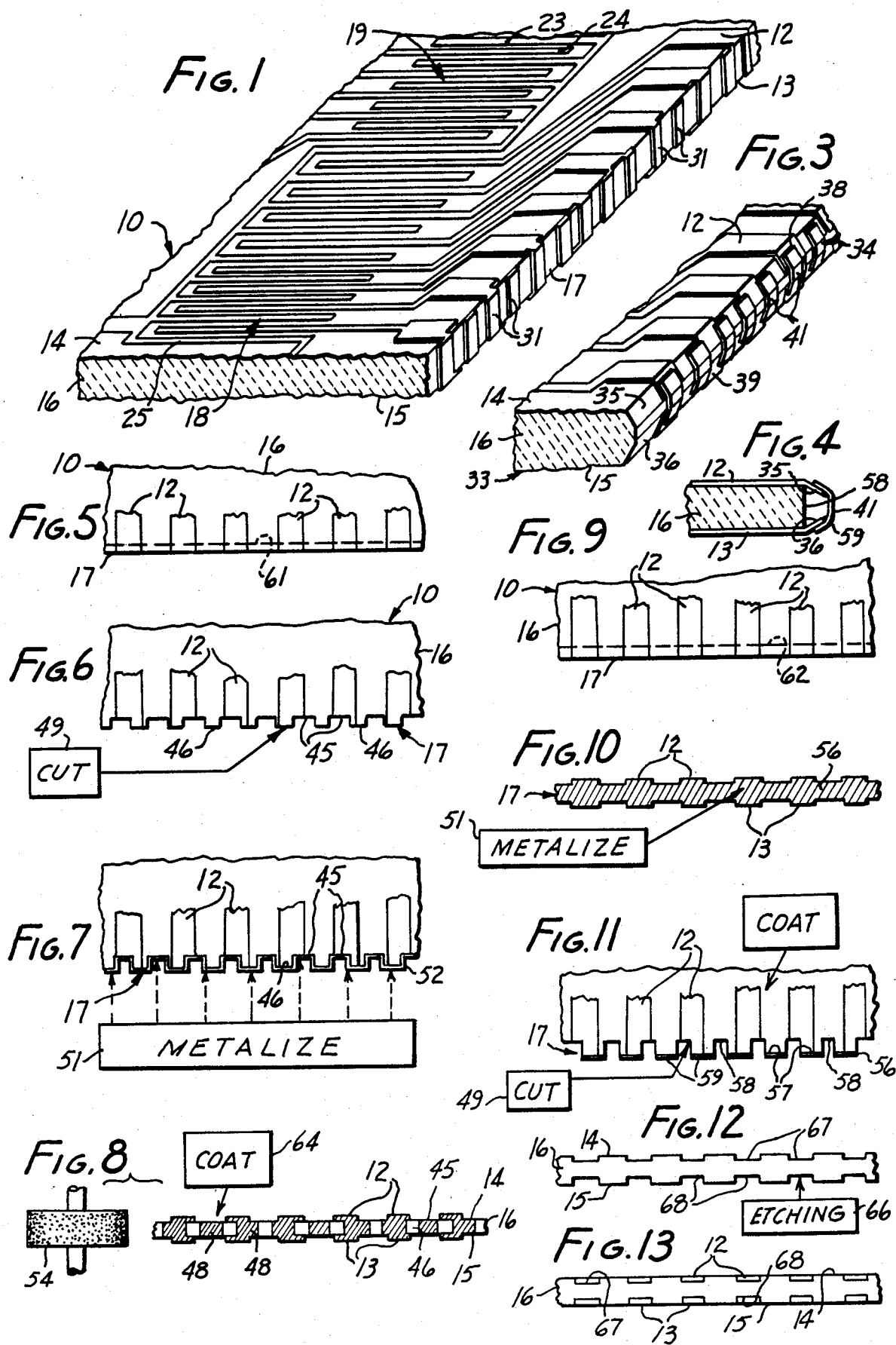

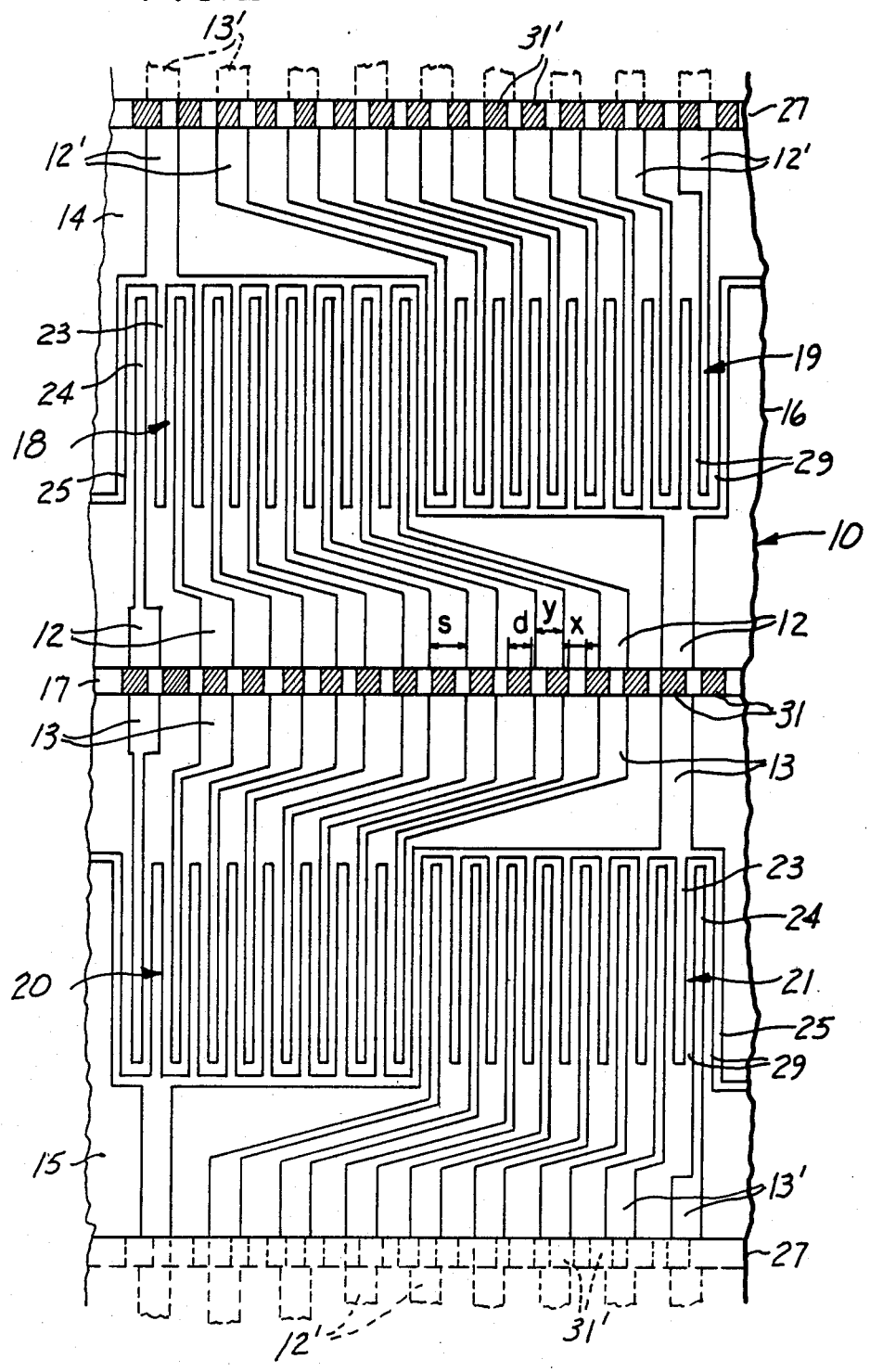

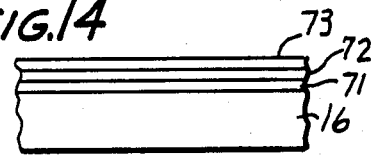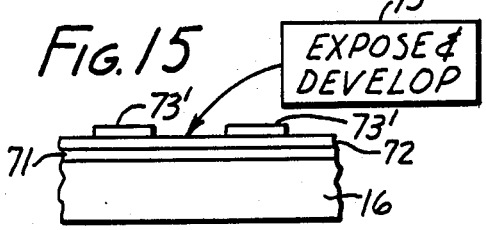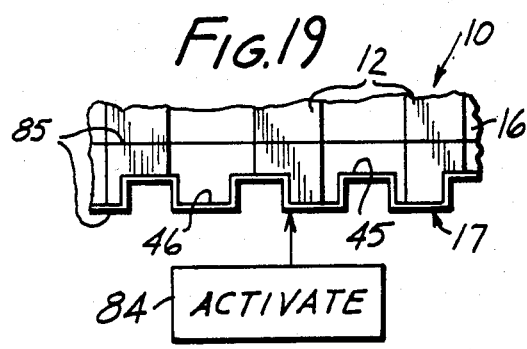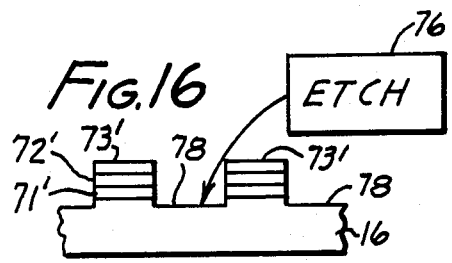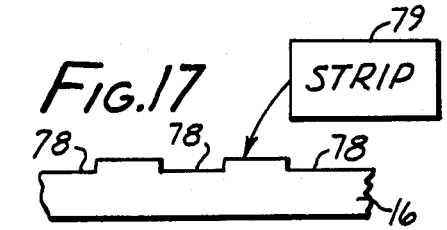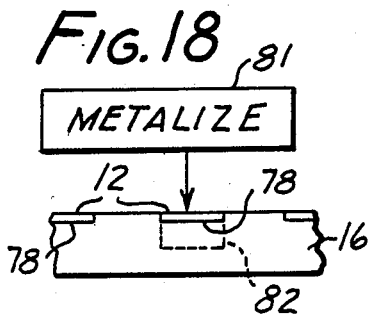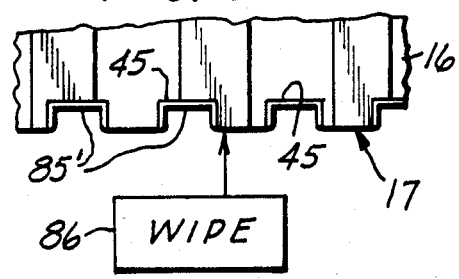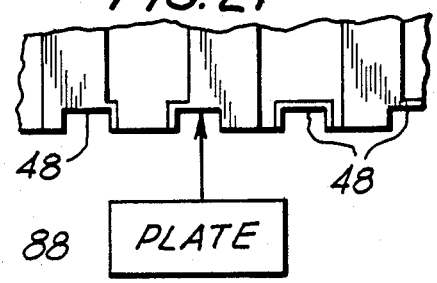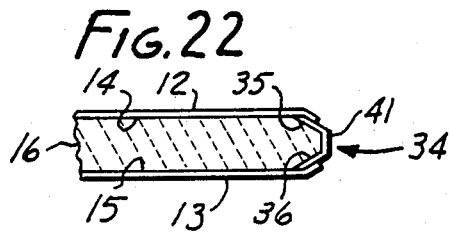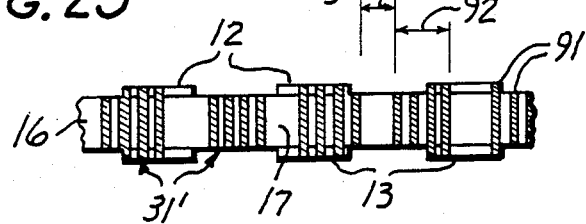

ELECTRODE STRUCTURES AND INTERCONNECTING SYSTEM

BACKGROUND OF THE INVENTION

1. Field of the Invention

The subject invention relates to electrode structures, to electrode interconnecting systems, to circuit boards and, more specifically, to methods of providing electrode structures on substrates, to methods of providing circuit boards, to methods of interconnecting first and second electrodes extending on opposite faces of the same substrate, to methods of preparing electrooptical light gate structures, to articles of manufacture including electrodes, and to electrooptical light gate structures.

2. Disclosure Statement

This disclosure statement is made pursuant to the duty of disclosure imposed by law and formulated in 37 CFR 1.56(a). No representation is hereby made that information thus disclosed in fact constitutes prior art, inasmuch as 37 CRF 1.56(a) relies on a materiality concept which depends on uncertain and inevitably subjective elements of substantial likelihood and reasonableness, and inasmuch as a growing attitude appears to require citation of material which might lead to a discovery of pertinent material.

To provide for a solder-less connection between adjacent substrates, it has been proposed to provide a deformable elongate core with a plurality of mutually spaced electrically conducting loops. According to one of these proposals, announced under the trademark Elastomate by AMP Incorporated, of Harrisburg, Pa. 17105, individual parallel lines of metal are plated on a thin flexible film which is wrapped around a soft rod of an elastomer, such as silicone rubber.

When such a connector is compressed between two parallel substrates, it is said to be capable of interconnecting printed or plated corresponding circuit elements or pads on the two adjacent substrates.

A similar deformable connector of rectangular cross-section has been shown by J. Marshall and F. Rode in the article "Solder Bump Interconnected, Multiple Chip, Thick Film Hybrid for 40-Character Alphanumeric LCD Application," in SOLID STATE TECHNOLOGY (January 1979) pp. 87 et seq.

In electrooptical light gate structures and other equipment where stresses would impair output or operation, the proposed deformable connector approach would not be feasible. Also, availability of flexible connectors has not solved the problem of interconnecting electrode arrays which are located on opposite sides or faces of the same substrate. This problem has received considerable attention as a result of efforts to lower the necessary driving voltage and otherwise improve the performance of electrooptical light gates by providing the driving electrode arrays on both sides of the electrooptically active substrate as proposed, for instance, in British Patent Specification No. 1,534,027, by Battelle Memorial Institute, published Nov. 29, 1978.

In principle, one could interconnect such oppositely positioned electrode arrays by depositing electrically conducting crossovers through a mask over the substrate edges, with such mask being aligned with the pads or electrode portions at the particular edge. Such a method, however, would pose great aligning problems, especially in large-scale production. This problem complex is, of course, not limited to the context of light gate structures, but applies to various other circuit board or substrate arrangements wherein distinct electrode arrays on different sides of the same substrate are to be interconnected.

In the electrooptical area, electrode arrays on light gate substrates have frequently been provided by thin film techniques and masking or photolithography and etching. Briefly, this involved a deposition of a thin metal film on the electrooptical substrate and a selective removal of parts of the film, leaving optimally the desired electrode arrays on the substrate. Light gate structures made by these methods, especially in the case of very narrow gates, were burdened by an adverse effect of the edges of the gate on the field distribution resulting in higher field intensities required to open the gate.

In an attempt to overcome this difficulty and to provide for a lowering of the requisite driving voltage, electrodes have been formed by depositing metallization in mechanically machined grooves. Reference may in this respect be had to U.S. Pat. No. 3,873,187, by Robert E. Brooks, proposing to cut grooves through a layer of lanthanum-modified lead zirconate titanate and into a supporting substrate, and to form electrodes by placing wires and conductive paste into these cut grooves. The disadvantage of such an approach is that machining inevitably causes chipping of the edges and of the surface, internal stresses near the cut edges and mechanical weakening of the ferroelectric ceramic substrate or chip due to the notch effect of the cut grooves. Also, mechanical machining approaches typically limit the electrode configuration to straight lines and also limit achievable electrode density.

SUMMARY OF THE INVENTION

It is an object of this invention to overcome the disadvantages expressed or implicit in the preceding disclosure statement.

It is a related object of this invention to provide improved electrode structures.

It is a germane object of this invention to provide improved electrode structures having several first and second electrodes extending in mutual registration on opposite faces of a substrate and being mutually interconnected.

It is also a related object of this invention to provide improved methods for making the electrode structures mentioned in the preceding two objects.

It is also an object of this invention to provide improved methods of interconnecting several first and second electrodes extending in mutual registration on opposite faces of the same substrate.

It is also an object of this invention to provide improved methods of preparing an electrooptical light gate structure with the aid of an etching process.

It is a related object of this invention to provide improved electrooptical light gate structures.

It is also an object of this invention to provide improved articles of manufacture as more fully apparent in the further course of this disclosure.

Other objects of the subject invention will also become apparent in the further course of this disclosure.

From one aspect thereof, the subject invention resides in a method of providing interconnections for several first and second electrodes extending in mutual registration on opposite faces, respectively, of the same substrate to an edge portion thereof, comprising in combination the steps of providing on said edge portion a plurality of electrically conductive deposits extending across said edge portion for electrically interconnecting corresponding first and second electrodes, said deposits being distributed along said edge portion in a pattern including a recurring deposit width smaller than the smallest spacing between any adjacent two electrodes of either of said first and second electrodes, alternating with a recurring deposit spacing smaller than the smallest width of any of said first and second electrodes.

From another aspect thereof, the subject invention resides in a method of providing an electrode structure on a substrate having an edge portion extending between opposite faces of the substrate. The invention according to this aspect resides, more specifically, in the improvement comprising in combination the steps of providing several first and second electrodes extending in mutual registration on said opposite faces, respectively, to said edge portion, said deposits being distributed along said edge portion in a pattern including a recurring deposit width smaller than the smallest spacing between any adjacent two electrodes of either of said first and second electrodes, alternating with a recurring deposit spacing smaller than the smallest width of any of said first and second electrodes.

From another aspect thereof, the subject invention resides in a method of providing an electrode structure on a substrate having an edge portion extending between opposite first and second faces of the substrate. The invention according to this aspect resides, more specifically, in the improvement comprising in combination the steps of providing along said edge portion spaced first and second bevels extending, respectively, along said opposite first and second faces of the substrate, providing several first and second electrodes extending in mutual registration on said opposite first and second faces of the substrate and onto said first and second bevels, respectively, and providing on said edge portion a plurality of electrically conductive deposits extending across said edge portion onto said first and second bevels for electrically interconnecting corresponding first and second electrodes, said deposits being distributed along said edge portion in a pattern including a recurring deposit width smaller than the smallest spacing between any adjacent two electrodes of either of said first and second electrodes, alternating with a recurring deposit spacing smaller than the smallest width of any of said first and second electrodes.

From another aspect thereof, the subject invention resides in a method of preparing an electrooptical light gate structure and, more specifically, resides in the improvement comprising in combination the steps of making a substrate of a ferroelectric ceramic material displaying field induced birefringence, and providing a pattern of electrodes on said substrate by etching a pattern of grooves corresponding to said electrode pattern into said substrate, and depositing electrically conductive material in said grooves.

From another aspect thereof, the subject invention also resides in an article of manufacture comprising, in combination, a substrate having an edge portion extending between opposite faces of said substrate, several first and second electrodes extending in mutual registration on said opposite faces, respectively, to said edge portion, and means for electrically interconnecting corresponding first and second electrodes, comprising a plurality of electrically conductive deposits extending across said edge portion and being distributed along said edge portion in a pattern including a recurring deposit width smaller than the smallest spacing between any adjacent two electrodes of either of said first and second electrodes, alternating with a recurring deposit spacing smaller than the smallest width of any of said first and second electrodes.

From another aspect thereof, the subject invention also resides in an article of manufacture comprising, in combination, a substrate having an edge portion extending between opposite faces of said substrate and having spaced first and second bevels extending, respectively, along said opposite first and second faces of the substrate, several first and second electrodes extending in mutual registration on said opposite first and second faces of the substrate and onto said first and second bevels, respectively, and means for electrically interconnecting corresponding first and second electrodes, comprising a plurality of electrically conductive deposits extending across said edge portion onto said first and second bevels and being distributed along said edge portion in a pattern including a recurring deposit width smaller than the smallest spacing between any adjacent two electrodes of either of said first and second electrodes, alternating with a recurring deposit spacing smaller than the smallest width of any of said first and second electrodes.

From another aspect thereof, the subject invention also resides in an electrooptical light gate structure made by a method comprising in combination the steps of making a substrate of a ferroelectric ceramic material displaying field induced birefringence, and providing a pattern of electrodes on said substrate by etching a pattern of grooves corresponding to said electrode pattern into said substrate and depositing electrically conductive material in said grooves.

Electrooptical light gate structures so made according to the latter aspect of the subject invention are characterized by several advantages and quality improvements relative to light gate structures made with the aid of mechanical machining, but are not believed to be distinctly claimable in structural terms. Advantages of electrooptical light gate structures made according to the latter aspect of the subject invention and its preferred embodiments include better quality of the light gate edges and of the substrate surface, absence of internal stresses at and in the light gates and the absence of the type of mechanical weakening that would plague light gate structures with mechanically machined grooves. Also, the subject invention avoids restriction to the straight grooves and electrode configurations that have characterized the results of mechanical machining techniques in the area under consideration.

BRIEF DESCRIPTION OF THE DRAWINGS

The subject invention and its various aspect and objects will become more readily apparent from the following detailed description of preferred embodiments thereof, illustrated by way of example in the accompanying drawings, in which like reference numerals designate like or functionally equivalent parts, and in which:

FIG. 1 is a fractional perspective view of an electrode structure according to a preferred embodiment of the subject invention;

FIG. 2 is a development on a plane of the electrode structure of FIG. 1;

FIG. 3 is a fractional perspective view of an electrode structure according to a further preferred embodiment of the subject invention;

FIG. 4 is a transverse section through an electrode structure according to yet another preferred embodiment of the subject invention;

FIGS. 5 to 8 constitute a flowsheet type of illustration of a method of making an electrode structure;

FIGS. 9 to 11 constitute a flowsheet type of illustration of another method of making an electrode structure in accordance with a further preferred embodiment of the subject invention;

FIGS. 12 to 18 constitute a flowsheet type of illustration of phases of a further method of making an electrode structure in accordance with another preferred embodiment of the subject invention.

FIGS. 19 to 22 constitute a flowsheet type of illustration of phases of a further method for providing interconnecting edge deposits; and FIG. 23 is a detail view of a modification in accordance with an embodiment of the subject invention.

DESCRIPTION OF PREFERRED EMBODIMENTS

The electrode structure 10 shown in perspective in FIG. 1 and in its projection or development on a flat plane in FIG. 2, has several first and second electrodes 12 and 13 extending in mutual registration on opposite first and second faces 14 and 15, respectively, of the same substrate, board or panel 16. In particular, the first and second electrodes 12 and 13 extend to an edge portion 17 of the substrate 16.

As seen in FIGS. 1 and 2 jointly, the electrodes on the opposite faces 14 and 15 of the same substrate 16 may be arranged in the form of electrode arrays. For instance, the electrodes on the substrate face 14 may be subdivided into first and second electrode arrays 18 and 19 alternating with each other along an elongate region of the substrate 16, only part of which is shown in FIGS. 1 and 2. Similarly, the electrodes on the second substrate face 15 may be subdivided into third and fourth electrode arrays 20 and 21 alternating with each other along an elongate region of the substrate 16 extending in registry with the elongate region along which the alternating first and second electrode arrays 18 and 19 are arranged or distributed.

Each of the electrode arrays 18 to 21 may include a plurality of electrodes which, for instance, may comprise alternating common and single electrodes 23 and 24 in a dual aperture gate. In that case, the common electrodes 23 may include a serpentine electrode 25 which extends throughout the first and second arrays on the same face of the substrate 16.

On the other hand, the electrodes on the substrate face 14, as well as the electrodes on the opposite substrate face 15 may comprise alternating individual electrodes, such as in the context of a single aperture gate structure, as distinguished from the dual aperture gate structure shown in FIGS. 1 and 2.

In either case, the above mentioned first electrodes 12 and their counterpart 12' extending on the same substrate face 14 to the other edge 27 of the substrate 16 may be viewed as pads or terminals of the electrode elements 23 and 24 in the arrays 18 and 19. Similarly, the electrodes 13 and their counterparts 13' extending on the same second substrate face 15 to the substrate edge 27 may be viewed as terminals or pads of the electrode elements in the third and fourth electrode arrays 20 and 21.

In this respect, it constantly has to be kept in mind that FIG. 2 is a development or projection on a flat plane, whereby the second substrate edge 27 consequently appears at the top and at the bottom of the figure. To facilitate the understanding of the subject invention, the showing of the pads, terminals or electrodes 12' has been repeated in dotted outline at the bottom of FIG. 2. Similarly, the showing of pads, terminals or electrodes 13' has been repeated in dotted outline at the top of FIG. 2.

Corresponding pads, terminals or electrodes 12 and 13 extend in registration with each other to the edge 17 on opposite faces of the substrate 16, and corresponding pads, terminals or electrodes 12' and 13' extend in mutual registration on the opposite substrate faces 14 and 15 to the second edge 27 of the substrate 16.

The expression "extending on" herein employed with respect to any of the electrodes is not meant to be understood in a limiting sense. Rather, as will become more fully apparent with respect to FIGS. 12 and 13, for instance, this expression is intended to be broad enough to cover instances where electrodes are accommodated in grooves or extend otherwise at or near a substrate surface or substrate surfaces.

As seen in FIG. 2, the first and third electrode arrays 18 and 20 are mirror images of each other, and the same applies to the second and fourth electrode arrays 19 and 21, as well as to the serpentine common electrode 25 and the pads, terminals or electrodes 12 and 13, and 12' and 13', respectively. In this manner, light gates are defined not only by electrode pairs on the same substrate face, but also by pairs of registering electrodes composed of electrode elements located on opposite faces. In practice, this advantageously lowers the requisite light gate driving voltage and also provides for a better definition of the light gate. As a particular advantage, the light gate resolution can be increased considerably by a closer mutual spacing of the light gate electrodes, relative to effective substrate thickness, if corresponding electrodes are placed on both major surfaces of the substrate, as distinguished from arrangements in which the substrate is electroded on only one side.

According to a preferred embodiment of the subject invention, the substrate 16 is made of or comprises electrooptically active light gate material.

The adjective "active" in the latter statement is not intended to signify the opposite of "passive" but is rather used in the sense of being capable of acting, functioning or working. For instance, the substrate 16 may be made of or comprise a ferroelectric ceramic material displaying field induced birefringence. As already indicated, a particularly suitable ferroelectric ceramic material is lanthanum-modified lead zirconate titanate (PLZT).

Of course, the utility of the subject invention is broader than light gate structures and extends to such devices as printed or plated circuit board and other electrodes substrates. Accordingly, the elements 12, 12', 13 and 13' will at times simply be considered as electrodes herein.

The task of the currently considered aspect of the subject invention simply is to interconnect the several first and second electrodes 12 and 13 extending in mutual registration on opposite first and second faces 14 and 15, respectively, of the same substrate 16 to an edge portion 17 thereof. Similarly, principles of the subject invention may be employed to interconnect several first and second electrodes 12' and 13' extending in mutual registration on the opposite first and second faces 14 and 15, respectively, of the substrate 16 to a second edge portion 27 thereof. In this context, the phrase "interconnecting several first and second electrodes" is not intended to denote an interconnection of all these electrodes by a common conductor. Rather, the first and second electrodes 12 and 13 or 12' and 13' are interconnected by individually interconnecting pairs of corresponding electrodes extending in mutual registration on opposite substrate faces 14 and 15.

If a conventional approach were to be pursued in interconnecting corresponding first and second electrodes 12 and 13 across the substrate edge 14, one would attempt to provide on the edge 17 cross-over leads or pads in registry with corresponding first and second electrodes 12 and 13 and mutually spaced at the same distance as the particular first or second electrodes. Most typically, one would attempt to accomplish such task by the provision of a mask aligned with the electrodes 12 and 13 and extending along the edge 17. This, however, would provoke alignment problems and would otherwise impede manufacture, particularly in a large-scale production setting.

To overcome these difficulties and to provide broadly feasible interconnecting techniques, the subject invention in a sense proceeds a course of random pattern placement with respect to the electrodes to be interconnected.

In particular, the subject invention in its currently discussed aspect provides on the edge portion 17 a plurality of electrically conductive deposits 31 extending across the edge portion 17 for electrically interconnecting corresponding first and second electrodes 12 and 13. According to the invention, the width of the deposits 31 in the longitudinal direction of the edge portion 17 differs from the width of individual electrodes 12 or 13, while the spacing between adjacent deposits 31 differs from the spacing between adjacent electrodes 12 or 13. Rather, the width of the deposits 31 corresponds to the spacing between adjacent electrodes 12 or 13, while the spacing between adjacent deposits 31 corresponds to the width of individual electrodes 12 or 13, in a manner hereinafter more fully disclosed.

In accordance with the illustrated preferred embodiment, the deposits 31 are distributed along the edge portion 17 in a pattern including a recurring deposit width (d) smaller than the smallest spacing (s) between any adjacent two electrodes of either of the first and second electrodes 12 and 13, alternating with a recurring deposit spacing (x) smaller than the smallest width (y) of any of the first and second electrodes 12 and 13. The same principle may be applied to the second edge portion 27 when it is desired to interconnect corresponding electrodes 12' and 13'. In particular, there may be provided on the second edge portion 27 a plurality of electrically conductive deposits 31' extending across that edge portion 27 for electrically interconnecting corresponding electrodes 12' and 13'. The deposits 31' are distributed along the edge portion 27 in a pattern including a recurring deposit width smaller than the smallest spacing between any adjacent two electrodes 12' or 13', alternating with a recurring deposit spacing smaller than the smallest width of any of the electrodes 12' and 13'.

In the illustrated preferred embodiment, the electrodes 12, the electrodes 12', the electrodes 13 and the electrodes 13' are spaced at equal distances from each other. In that case, the deposits 31 and 31' are distributed along the edge portions 17 and 27, respectively, in a pattern including a recurring deposit width smaller than the recurring spacing between electrodes 12, 12', 13 or 13'. Similarly, the individual electrode 12, 12', 13 and 13' are of a uniform electrode width at the edge portion 17 or 27. Accordingly, the recurring deposit spacing alternating with the recurring deposit width in the latter pattern is smaller than the uniform electrode width.

On the other hand, if electrode spacing or electrode width are irregular, then the deposits 31 and 31' should be distributed in the above mentioned pattern including a recurring deposit width smaller than the smallest spacing between any adjacent two electrodes of either of the electrodes 12 and 13 or 12' and 13', alternating with a recurring deposit spacing smaller than the smallest width of any of the electrodes 12 and 13 or 12' and 13'.

The deposits 31 and 31' may be realized on the edge portions 17 and 27 with the aid of a mask or by photolithography and etching, employing one or more metals or other substances for realizing electrically conducting deposits engaging or contacting corresponding electrodes, terminals or pads.

The electrode structure 33 partially shown in FIG. 3, and relevant aspects of its method of manufacture, are similar to the structure and methods so far discussed with reference to FIGS. 1 and 2.

In particular, the electrode structure 33 also comprises a substrate 16 which, by way of example, may be made or comprise any of the materials mentioned above with respect to the electrode structure 10.

According to a further preferred embodiment of the subject invention, the substrate 16 of the electrode structure 33 has provided along an edge portion 34 spaced first and second bevels 35 and 36 extending, respectively, along the opposite first and second faces 14 and 15 of the substrate. First and second electrodes 12 and 13 of the type mentioned above extend or are extended in mutual registration on the opposite first and second faces 14 and 15 of the substrate, and extend further onto the first and second bevels, respectively, as shown in FIG. 3 at 38 for a first electrode 12 and at 39 for a second electrode 13.

According to the first embodiment illustrated in FIG. 3, there are further provided on the edge portion 34 a plurality of electrically conductive deposits 41 extending across the edge portion 34 onto the first and second bevels 35 and 36 for electrically interconnecting corresponding first and second electrodes 12 and 13 at their extended portions 38 and 39, respectively. In the preferred embodiment illustrated in FIG. 3, the beveled edge 34 has an elongate frontal portion 34 extending between bevels 35 and 36 at right angles to either major surface 14 or 15 of the substrate. As shown in FIG. 3, the deposits 41 extend across the frontal portion 34 onto the bevel portions 35 and 36 or electrode extensions 38 and 39 on either side of the elongate frontal portion 34.

The spaced deposits 41 correspond in nature and function to the above mentioned deposits 31, and also interconnect corresponding first and second electrodes 12 and 13.

In particular, the deposits 41 are distributed along the edge portion 34 in a pattern including a recurring deposit width smaller than the smallest spacing between any adjacent two electrodes 12 or 13 of either of the mentioned first and second electrodes, alternating with a recurring deposit spacing smaller than the smallest width of any of the first and second electrodes 12 and 13. As in the case of the electrode structure of FIGS. 1 and 2, the width of the deposit 41 may be smaller than the uniform spacing between electrodes 12 or 13, if such spacing is uniform in the case of the electrode structure 33. Similarly, such uniform deposit width may alternate with a recurring spacing between adjacent deposits 41 smaller than a uniform electrode width, if the electrodes 12 and 13 as shown in FIG. 3 are of such uniform width.

An electrode structure 10 of the type shown in FIGS. 1 and 2, but without the deposits 31, may be used as a blank, illustrated in FIG. 5, for providing the requisite interconnecting deposits. In particular, and as shown in FIG. 6, grooves 45 are provided in the edge portion 17 of the substrate 16. According to a preferred embodiment of the subject invention, these grooves are distributed along the edge portion in a pattern including a recurring groove width smaller than the smallest spacing between any adjacent two electrodes 12 or 13 of either of the first and second electrodes 12 and 13 (see FIG. 8). The grooves 45 alternate with a recurrent intergroove spacing 46 smaller than the smallest width of any of the first and second electrodes 12 and 13.

As more fully discussed below, and as shown in FIG. 8, conductive deposits 48 corresponding to the above mentioned electrode interconnecting deposits 31 are provided in the grooves 45.

A block 49 in FIG. 6 symbolizes a tool, such as a saw, or a process, such as photolithography and etching, for cutting the grooves 45 into the edge portion 17.

A block 51 in FIG. 7 symbolizes an apparatus and a method for depositing a layer of a metal or other desired electrically conductive material on the indented edge portion 17, with such layer 52 covering the indented edge portion, including peaks 46 and valleys 45 thereof. A rotatable grinding wheel or wire brush 54 in FIG. 8 symbolizes such tools or other means for removing the portions of the layers 52 which are located on the peaks 46, thereby leaving, as shown in FIG. 8, the desired deposits 48 having the recurring deposit width and interdeposit spacing herein defined with reference to the deposits 31 in FIGS. 1 and 2, for instance.

In particular, the method of FIGS. 6 to 8 constitutes an example of a preferred embodiment of the subject invention in which the edge portion 17 is provided with an indented profile composed of peaks 46 and valleys 45 alternating along the edge portion with any of the valleys 45 being provided (see block 49) with a width smaller than the smallest spacing between any adjacent two electrodes of either of the first and second electrodes 12 and 13, and any of the peaks being provided with a width smaller than the smallest width of any of the first and second electrodes 12 and 13. The conductive deposits 48 shown in FIG. 8 are provided across the valleys 45 in order to individually interconnect adjacent corresponding electrodes 12 and 13.

A method according to a further preferred embodiment of the subject invention is shown in FIGS. 9 to 12. According to FIG. 9, an electrode structure 10 or electroded substrate 16 similar to the structure shown in FIGS. 1, 2 and 5, for instance, may be employed to practice the process more specifically shown in FIGS. 10 and 11.

That process covers the edge portion 17 with an electrically conductive layer 56 extending along and across the edge portion for electrically interconnecting the first and second electrodes 12 and 13. The layer 56 is typically applied while the edge portion 17 is in a straight or unintended configuration. The above mentioned equipment 51 may again be employed to plate, vaporize, sputter or otherwise deposit the layer 56 onto the edge portion 17.

According to FIG. 11, the above mentioned equipment 49 may be employed for removing the conductive layer 56 at intervals 57 smaller than the smallest spacing between any adjacent two electrodes of either of the first and second electrodes 12 and 13, with the width 58 of any conductive layer removal between any adjacent two intervals being smaller than the smallest width of any of the first and second electrodes 12 and 13. As in the case of FIG. 6, cutting saw devices or photolithography and etching processes may be employed for executing the layer removals at 58 in FIG. 11.

The process illustrated with the aid of FIGS. 9 to 11 thus constitutes a preferred embodiment of the subject invention in which the edge portion 17 is provided with an indented profile composed of peaks 57 and valleys 58 alternating along the edge portion, with any of the peaks 57 being provided with a width smaller than the smallest spacing between any adjacent two electrodes of either of the first and second electrodes 12 and 13, and any of the valleys 58 being provided with a width smaller than the smallest width of any of the first and second electrodes 12 and 13. Conductive deposits 59 are provided across the peaks 57 to interconnect corresponding electrodes 12 and 13 across the edge portion 17.

As already indicated, the deposits 59, which correspond in size and spacing to the above mentioned deposits 31, for instance, may be provided by removing portions of the conductive layer 56, such as by cutting into the edge portion 17 of the substrate at the intervals 57.

In particular, portions of the conductive layer 56 may be removed by executing cuts into the edge portion of the substrate at the intervals 57, with each cut having a width 58 being smaller than the smallest width of any of the first and second electrodes 12 and 13.

As indicated by a dotted line 61 in FIG. 5 and by dotted line 62 in FIG. 9, the methods according to FIGS. 5 to 8 and 9 to 11 may also be practised with a beveled edge portion, such as the edge portion 34 including first and second bevels 35 and 36 extending, respectively, along the opposite first and second faces 14 and 15 of the substrate 16.

In that case, the equipment 51 may be employed to cover the edge portion with an electrically conductive layer extending along the edge portion and across onto the first and second bevels (see 35 and 36 in FIG. 3) for electrically interconnecting the first and second electrodes 12 and 13. The removal technique illustrated in FIG. 11 may then be employed for removing portions of the conductive layer across such conductive layer onto the first and second bevels at intervals 57 smaller than the smallest spacing between any adjacent two electrodes of either of the first and second electrodes 12 or 13, with the width 58 of any conductive layer removal between any adjacent two intervals 57 being smaller than the smallest width of any of the first and second electrodes.

A transverse section through a beveled electrode structure thus obtained is partially shown in FIG. 4. As in the case of the beveled electrode structure 33 shown in FIG. 3, deposits 41 interconnect corresponding electrodes 12 and 13 after portions of the previously deposited conductive layer have been removed, such as by cutting into the edge portion and first and second bevels 35 and 36 at the intervals 57.

In particular, portions of the previously deposited conductive layer may be removed by executing cuts into the edge portion and first and second bevels at the intervals 57, with each cut having a width 58 being smaller than the smallest width of any of the first and second electrodes 12 and 13.

Beveled electrodes of the type shown in, or discussed in connection with, FIGS. 3 and 4 are presently preferred over straight edged electrode structure of the type shown in FIGS. 1 and 2, since a more reliable bond between the electrode extensions 38 and 39 and deposits 41 are believed to be achievable in the beveled structure.

As in the case of FIGS. 1 and 2, the techniques and electrode structure shown in FIGS. 3 to 11 are not limited in their utility to light gate structures, but may be employed in other contexts, such as plated or printed circuit boards or other electroded substrates.

However, if these techniques and electrode structures are applied to electrooptically active substrate, then, as diagrammatically indicated in FIGS. 8 and 11 by a block 64, an antireflective coating, such as a thorium fluoride coating or a silicon oxide (e.g. silicon dioxide) coating, may be applied to the light gates on either or both sides 14 and 15 of the electrode structure.

This considerably enhances the effectiveness and efficiency of the light gate structure.

In viewing FIGS. 1 to 12, it will be noted that the arrays of conductive deposits 31, 31', 34, 48 and 59 are randomly or pseudo-randomly distributed relative to electrodes 12 and 13, in the sense that they do not follow in their spacing the spacing between these electrodes 12 and 13. In consequence, this leaves a few of the deposits 31 etc. situated in an empty space between adjacent electrodes 12 or 13. This, in practice is, however, a small price to pay for the advantages realized by the exercise of the subject invention including dispensation from the previous need of having to align conductive deposits or similar crossovers with the electrodes to be interconnected, in a cumbersome and time-consuming operation.

The electrodes or electrode arrays thus interconnected, as well as the electrodes presently to be described with reference to FIGS. 12 and 13, may be connected to whatever electronic circuitry or other equipment (not shown) will serve the purpose of the particular electrode arrays or arrangements, or of the substrate on which the electrodes are located or in which they are embedded.

As mentioned above, special problems occur if it is desired to embed the electrodes 12 and 13 into a ferroelectric ceramic substrate 16 at the opposite faces 14 and 15.

As indicated by the block 66 in FIG. 12, the subject invention, according to a further aspect thereof, provides a solution of this problem by etching into the opposite faces 14 and 15 of the substrate 16 first and second patterns of grooves 67 and 68 corresponding, respectively, to the several first and second electrodes 12 and 13.

By way of example, the etched patterns of grooves may comprise the electrode array configurations shown in FIGS. 1 and 2.

The electrodes 12 and 13 may then be deposited in corresponding grooves 67 and 68 of the first and second groove patterns, respectively. The electrodes 12 and 13 and, if desired, the electrode arrays connected thereto, may thus be realized by providing metal deposits in the grooves or groove patterns 67 and 68. The technique illustrated in FIGS. 12 and 13 according to a preferred embodiment of the subject invention may thus be employed in preparing an electrooptical light gate structure by making a substrate of ferroelectric ceramic material displaying field-induced birefringence, and by providing a pattern of electrodes such as the electrodes 12 with electrode arrays 18 and 19, if desired, on the ceramic substrate 16 by etching a pattern of grooves 67 corresponding to the electrode pattern into the substrate, and depositing electrically conductive material in these grooves.

The latter pattern of grooves may be etched on one face 14 of the substrate, and a second pattern of grooves 68 may be etched on the opposite face 15 of the substrate. Electrically conductive material is then deposited in the grooves of the second pattern to provide a second pattern of electrodes, such as the electrodes 13 and, if desired, the electrode arrays 20 and 21. Preferably, both patterns of grooves and both patterns of electrodes are in registry with each other on the opposite faces 14 and 15 of the substrate 16.

Reference may now be had to the flowsheet type of illustration of FIGS. 14 to 18.

For example, a layer of chromium 71 is deposited on the ferroelectric ceramic substrate 16, and a layer of gold 72 is, in turn, deposited onto the chromium layer 71. Conventional methods, such as sputtering or vacuum deposition, may be employed for this purpose. By way of example, the coating 71 may have a thickness of from 50 to 500 nm (nanometer) and the layer 72 may have a thickness of from 400 to 1000 nm. The layer 72, in turn, is coated with a layer of negative photoresist material 73. By way of example, the thickness of the coating 73 may be on the order of 1000 nm. The layer 73 may be cured in a conventional manner, providing the multilayer structure diagrammatically illustrated in FIG. 14.

As indicated by the block 75 in FIG. 15, the photoresist layer is photographically exposed and developed. In particular, the layer 73 may be exposed through a mask or pattern which is a negative of the desired electrode pattern.

Exposure, development and curing of the photoresist layer 73 leaves etch-resistant deposits 73' on the layer 72 as seen in FIG. 15.

As indicated by the block 76 in FIG. 16, an etching solution is then applied to the assembly shown in FIG. 15. A standard gold etchant may be applied for this purpose, to etch away the gold of the layer 72 except for deposits 72' below the photoresist deposit 73'.

Similarly, the chromium in the layer 71 is etched away except for deposits 71' below the previously mentioned deposits 72' and 73'. A standard chromium etchant may be used for that purpose. Gold and chromium etchants and etching techniques are well known and widely used and reference may, for instance, be had to L. I. Maissel and R. Glang, HANDBOOK OF THIN FILM TECHNOLOGY (McGraw-Hill, 1970, pp. 7–36 and 7–37).

The ferroelectric ceramic substrate 16 may then be etched as indicated at 78 in FIG. 16. To this end, the substrate 16 may be rinsed and dried, mounted on a stainless steel carrier or plate (not shown), such as by means of a wax layer (not shown) and dipped into a solution which will etch the material of the substrate 16.

By way of example, a solution of 50 to 100 ml phosphoric acid, 2–20 ml nitric acid and 10–50 ml water may be employed for etching the substrate 16 as shown in FIG. 16. Alternatively, an etching solution of 100–200 ml ferrous chloride, 500–800 ml hydrochloric acid and 250–500 ml water may be employed for this purpose. Both of these solutions have been successfully employed with substrates of PLZT material for providing electroded light gate structures.

The depth of the grooves 78 is controlled by etching time and temperature. By way of example, either of the etching solutions just mentioned may be at a temperature of 80°–180° F.

After etching, the substrate 16 is rinsed, dried and removed from any carrier on which it may have been mounted for etching purposes. Any mounting wax is dissolved by heat and/or a suitable solvent depending on the type of wax employed (e.g. trichloroethylene or acetone). As indicated by the block 79 in FIG. 17, the photoresist, gold and chromium deposits 71', 72' and 73' are stripped from the etched substrate 16. A standard photoresist stripper may be employed for this purpose. The chromium and gold deposits 71' and 72' may be removed by the same etchant as employed for etching the chromium and gold layers 71 and 72 according to FIG. 16.

The stripped etched substrate 16 shown in FIG. 17 is rinsed and dried preparatory to metallization indicated by the block 81 in FIG. 18.

Anyone of various known methods may be employed for depositing the electrodes 12 into the etched grooves 78 of the substrate 16. For instance, the electrode material, such as gold, may be applied by vacuum deposition or sputtering to the entire surface of the substrate 16, including the etched grooves 78 and the substrate surface areas located therebetween. The metallization inside the grooves 78 may then be protected by photoresist, employing, for instance, standard photolithographic methods to define the electrode pattern and for etching the metallization away everywhere except in the grooves 78. This is followed by stripping of the photoresist, whereupon the electrodes 12 remain in the grooves 78 of the substrate 16 as seen in FIG. 18.

By way of further example, standard electroless nickel and gold plating techniques may be employed for providing the electrodes 12 in the grooves 78. For instance, the etched substrate 16 shown in FIG. 17 may first be dipped into an electroless plating activator, covering the entire surface of the substrate 16, including the grooves 78. This applied activator layer may then be wiped away from all areas of the substrate 16 between or outside of the grooves 78. In this manner, only the grooves 78 will contain activator material on which electroless nickel and/or gold plating can take place. By way of example, the thus activated substrate 16 may first be dipped into a conventional electroless nickel plating solution to provide nickel deposits in the activated grooves 78. This may be followed by rinsing and dipping of the substrate into a conventional electroless gold plating solution, which will provide gold deposits on top of the nickel deposits in the etched grooves 78.

As indicated by a dotted outline 82 in FIG. 18, the grooves 78 may be etched deeper than the height of the desired electrodes 12. In that case, the nickel and gold plating deposit, or other metallization, would cover the bottom and the walls of each etched groove. In practice, such an electrode configuration may be highly advantageous, especially in the context of an electrooptical light gate structure, where electrodes extending at an angle to a major surface of the substrate provide a particularly favorable electric field distribution.

Of course, the procedure shown in FIGS. 14 to 18 may readily be employed to provide electroded substrates of the type shown, for instance, in FIG. 13, having coincident electrodes 12 and 13 at both major surfaces thereof.

According to FIGS. 19 to 21, the photoconductive deposits 48 across the edge portion 17 of the substrate 16 are provided in accordance with a further embodiment of the subject invention by selectively activating only areas where the deposits are to be provided, and by then plating the activated areas. In particular, the areas where deposits 48 are to be provided are activated for subsequent plating, as will presently be explained.

According to FIG. 19, the previously mentioned substrate 16, cut or structured according to FIG. 6, is employed in the method shown in FIGS. 19 to 21. As indicated by the block 84 in FIG. 19, the edge portion 17 of the substrate is dipped into an electroless plating activator solution, leaving an activator layer as shown at 85 in FIG. 19. As indicated by the block 86 in FIG. 20, such activator layer is then wiped away from the substrate 16 and edge portion 17, except for the portions 85' of the activator layer situated in the grooves 45.

Accordingly, when the edge portion 17 of the substrate 16 is dipped into an electroless plating solution as indicated by the block 88 in FIG. 21, plating and material deposition will only take place inside the grooves 45 where the activator remnants 85' are located. The result is a series of deposits 48 which are pseudo-randomly distributed as shown in FIG. 8 and as explained above for individually interconnecting corresponding electrodes 12 and 13.

In the practice of the method shown in FIGS. 19 to 21, conventional activator and electroless plating solutions and techniques may be employed. Electroless plating, of course, is well known as such and is widely practised in various standard manufacturing operations.

In practice, the electrodes 12 and 13 and the interconnecting deposits 31, 41, 48, etc., may be applied in one and the same operation. This is particularly advantageous and efficient if the electrodes and the interconnecting deposits are provided in etched or cut grooves as shown in FIGS. 18 to 21.

Alternatively, the interconnecting deposits may be applied to substrates or other structures which have already been electroded.

On the other hand, the subject invention also covers methods in which the interconnecting deposits 31, 41, 48, 59, etc., are applied to the edge portion of a substrate 16 or similar structure prior to the application of any electrodes 12 or 13. For instance, substrates or circuit boards having interconnecting deposits across an edge portion may be manufactured and sold to users or other manufacturers which will apply their own electrode structures thereto.

In this respect, FIG. 22 shows a cross-section through a beveled substrate 16 which is similar to the substrate shown in FIG. 3, except that the interconnecting deposits 41 have been applied to the beveled edge portions 34 prior to the application of any electrodes 12 or 13.

In particular, the pseudo-randomly distributed deposits 41 may be provided on the beveled edge portion 43 of the substrate 16 which may then be distributed or sold for an application of the first and second electrodes 12 and 13 on the opposite faces 14 and 15 of the substrate 16, and in electrical contact with the deposits 41 only after the provision of these deposits 41 on the edge portion 34. The same technique may, of course, be employed with substrates having straight edge portions as shown, for instance, in FIG. 1.

In FIGS. 1, 3 and 8, for instance, each deposit 31, 41 and 48 has been shown as a solid or monolithic piece of electrically conductive material. However, within the scope of the subject invention, any of the deposits 31, 41, 48, etc., may be composed of a group of mutually spaced electrically conductive deposit elements. In this respect, FIG. 23 shows deposits 31' corresponding to the deposits 31 shown in FIGS. 1 and 2.

According to FIG. 23, each deposit 31' is composed of mutually spaced electrically conductive deposit elements 91 which extend across the edge portion 17 of the substrate 16, in order to interconnect corresponding electrodes 12 and 13 located on opposite faces of the substrate. Each of the groups 31' has an overall width 92 equal to the width of the deposit 31 as defined above within the scope of the subject invention.

Similarly, the spacing 93 between any two adjacent groups 31' is equal to the spacing defined above between adjacent deposits 31.

By way of example, the groups 31' shown in FIG. 23 may be distributed along the edge portion 17 in a pattern including a recurring deposit width 92 smaller than the smallest spacing between any adjacent two electrodes 12 or 13 of either of these first and second electrodes, alternating with a recurring deposit spacing 93 smaller than the smallest width of any of these first and second electrodes 12 and 13.

As in the case of the deposits 31 or of any other interconnecting edge deposits according to the subject invention, there will be deposits or deposit groups, such as the second group 31' from the left in FIG. 23, which do not interconnect any electrodes. On the other hand, there will be deposit groups, such as the first and third groups 31' from the left in FIG. 23, which contain elements 91 that interconnect corresponding electrodes 12 and 13. In addition, there will be deposit groups 31', such as the two groups at the extreme right of FIG. 23, wherein elements 91 of more than one group interconnect corresponding electrodes 12 and 13.

Of course, it will be recognized with respect to FIG. 23, and also with respect to other figures showing electrodes 12 and 13, that the term "electrode" as herein employed is broad enough to cover also terminals of electrode elements or arrays.

The subject extensive disclosure will render apparent or suggest to those skilled in the art various modifications and variations within the spirit and scope of the subject invention.

I claim:

1. In a method of providing interconnections for several first and second electrodes extending in mutual registration on opposite faces, respectively, of the same substrate to an edge portion thereof, comprising in combination the steps of:
   providing on said edge portion a plurality of electrically conductive deposits extending across said edge portion for electrically interconnecting corresponding first and second electrodes;
   said deposits being distributed along said edge portion in a pattern including a recurring deposit width smaller than the smallest spacing between any adjacent two electrodes of either of said first and second electrodes, alternating with a recurring deposit spacing smaller than the smallest width of any of said first and second electrodes.

2. In a method of providing an electrode structure on a substrate having an edge portion extending between opposite faces of said substrate, the improvement comprising in combination the steps of:
   providing several first and second electrodes extending in mutual registration on said opposite faces, respectively, to said edge portion; and
   providing on said edge portion a plurality of electrically conductive deposits extending across said edge portion for electrically interconnecting corresponding first and second electrodes;
   said deposits being distributed along said edge portion in a pattern including a recurring deposit width smaller than the smallest spacing between any adjacent two electrodes of either of said first and second electrodes, alternating with a recurring deposit spacing smaller than the smallest width of any of said first and second electrodes.

3. A method as claimed in claim 1 or 2, wherein said conductive deposits are realized by:
   providing said edge portion with an indented profile composed of peaks and valleys alternating along said edge portion, with any of said peaks being provided with a width smaller than the smallest spacing between any adjacent two electrodes of either of said first and second electrodes, and any of said valleys being provided with a width smaller than the smallest width of any of said first and second electrodes; and
   providing said conductive deposits across said peaks.

4. A method as claimed in claim 1 or 2, wherein said conductive deposits are realized by:
   providing said edge portion with an indented profile composed of peaks and valleys alternating along said edge portion, with any of said valleys being provided with a width smaller than the smallest spacing between any adjacent two electrodes of either of said first and second electrodes, and any of said peaks being provided with a width smaller than the smallest width of any of said first and second electrodes; and
   providing said conductive deposits across said valleys.

5. A method as claimed in claim 1 or 2, wherein said conductive deposits are provided by:
   covering said edge portion with an electrically conductive layer extending along and across said edge portion for electrically interconnecting said first and second electrodes; and
   removing portions of said conductive layer at intervals smaller than the smallest spacing between any adjacent two electrodes of either of said first and second electrodes, with the width of any conductive layer removal between any adjacent two intervals being smaller than the smallest width of any of said first and second electrodes.

6. A method as claimed in claim 5, wherein:
   portions of said conductive layer are removed by cutting into said edge portion of the substrate at said intervals.

7. A method as claimed in claim 5, wherein:
   portions of said conductive layer are removed by executing cuts into said edge portion of the substrate at said intervals, with each cut having a width being smaller than the smallest width of any of said first and second electrodes.

8. A method as claimed in claim 1 or 2, wherein said conductive deposits are realized by:
   selectively activating for plating only areas where said deposits are to be provided; and
   plating said activated areas to provide said deposits.

9. In a method of providing interconnections for several first and second electrodes extending in mutual registration on opposite first and second faces, respectively of a substrate having an edge portion extending between said opposite first and second faces of said substrate, the improvement comprising in combination the steps of:
   providing along said edge portion spaced first and second bevels extending, respectively, along said opposite first and second faces of the substrate;
   providing on said edge portion a plurality of electrically conductive deposits extending across said edge portion onto said first and second bevels for electrically interconnecting corresponding first and second electrodes;
   said deposits being distributed along said edge portion in a pattern including a recurring deposit width smaller than the smallest spacing between any adjacent two electrodes of either of said first and second electrodes, alternating with a recurring deposit spacing smaller than the smallest width of any of said first and second electrodes.

10. A method as claimed in claim 1 or 9, including the step of:
    providing said first and second electrodes on said opposite faces and in electrical contact with said deposits after provision of said deposits on said edge portion.

11. In a method of providing an electrode structure on a substrate having an edge portion extending between opposite first and second faces of said substrate, the improvement comprising in combination the steps of:
    providing along said edge portion spaced first and second bevels extending, respectively, along said opposite first and second faces of the substrate;
    providing several first and second electrodes extending in mutual registration on said opposite first and second faces of the substrate and onto said first and second bevels, respectively; and
    providing on said edge portion a plurality of electrically conductive deposits extending across said edge portion onto said first and second bevels for electrically interconnecting corresponding first and second electrodes;
    said deposits being distributed along said edge portion in a pattern including a recurring deposit width smaller than the smallest spacing between any adjacent two electrodes of either of said first and second electrodes, alternating with a recurring deposit spacing smaller than the smallest width of any of said first and second electrodes.

12. A method as claimed in claim 9 or 11, wherein said conductive deposits are realized by:
    providing said edge portion with an indented profile composed of peaks and valleys alternating along said edge portion, with any of said peaks being provided with a width smaller than the smallest spacing between any adjacent two electrodes of either of said first and second electrodes, and any of said valleys being provided with a width smaller than the smallest width of any of said first and second electrodes; and
    providing said conductive deposits across said peaks and onto said first and second bevels.

13. A method as claimed in claim 9 or 11, wherein said conductive deposits are provided by:
    covering said edge portion with an electrically conductive layer extending along said edge portion and across onto said first and second bevels for electrically interconnecting said first and second electrodes; and
    removing portions of said conductive layer across said conductive layer onto said first and second bevels at intervals smaller than the smallest spacing between any adjacent two electrodes of either of said first and second electrodes, with the width of any conductive layer removed between any adjacent two intervals being provided with a width smaller than the smallest width of any of said first and second electrodes.

14. A method as claimed in claim 13, wherein:
    portions of said conductive layer are removed by cutting into said edge portion and first and second bevels at said intervals.

15. A method as claimed in claim 13, wherein:
    portions of said conductive layer are removed by executing cuts into said edge portion and first and second bevels at said intervals, with each cut having a width being smaller than the smallest width of any of said first and second electrodes.

16. A method as claimed in claim 1, 2, 9 or 11, including the step of:
    making said substrate of electrooptically active light gate material.

17. A method as claimed in claim 16, including the steps of:
    etching into said opposite faces of the substrate first and second patterns of grooves corresponding, respectively, to said several first and second electrodes; and
    depositing said first and second electrodes in corresponding grooves of said first and second patterns, respectively.

18. A method as claimed in claim 16, including the step of:
    providing an antireflective coating on said material.

19. A method as claimed in claim 1, 2, 9 or 11, including the steps of:
    providing grooves in said edge portion extending across said edge portion and being distributed along said edge portion in a pattern including a recurring groove width smaller than the smallest spacing between any adjacent two electrodes of either of said first and second electrodes, alternating with a recurrent intergroove spacing smaller than the smallest width of any of said first and second electrodes; and
    providing said conductive deposits in said grooves.

20. A method as claimed in claim 9 or 11, wherein said conductive deposits are realized by:
    selectively activating for plating only areas where said deposits are to be provided; and
    plating said activated areas to provide said deposits.

21. A method as claimed in claim 1, 2, 9 or 11, including the steps of:
    composing any of said deposits of a group of mutually spaced electrically conductive deposit elements which extend across said edge portion for electrically interconnecting corresponding first and second electrodes; and providing said group with an overall width equal to said deposit width.

22. An article of manufacture comprising in combination:
a substrate having an edge portion extending between opposite faces of said substrate;
several first and second electrodes extending in mutual registration on said opposite faces, respectively, to said edge portion; and
means for electrically interconnecting corresponding first and second electrodes, comprising a plurality of electrically conductive deposits extending across said edge portion and being distributed along said edge portion in a pattern including a recurring deposit width smaller than the smallest spacing between any adjacent two electrodes of either of said first and second electrodes, alternating with a recurring deposit spacing smaller than the smallest width of any of said first and second electrodes.

23. An article of manufacture comprising in combination:
a substrate having opposite faces for receiving several first and second electrodes extending in mutual registration on said opposite faces, respectively, to an edge portion of said substrate; and
means for electrically interconnecting corresponding first and second electrodes, comprising a plurality of electrically conductive deposits extending across said edge portion and being distributed along said edge portion in a pattern including a recurring deposit width smaller than the smallest spacing between any adjacent two electrodes of either or said first and second electrodes, alternating with a recurring deposit spacing smaller than the smallest width of any of said first and second electrodes.

24. An article as claimed in claim 22 or 23, wherein:
said edge portion has an indented profile composed of peaks and valleys alternating along said edge portion, with any of said peaks having a width smaller than the smallest spacing between any adjacent two electrodes of either of said first and second electrodes, and any of said valleys having a width smaller than the smallest width of any of said first and second electrodes; and
said conductive deposits extend across said peaks.

25. An article as claimed in claim 22 or 23, wherein:
said edge portion has an indented profile composed of peaks and valleys alternating along said edge portion, with any of said valleys having a width smaller than the smallest spacing between any adjacent two electrodes of either of said first and second electrodes, and any of said peaks having a width smaller than the smallest width of any of said first and second electrodes; and
said conductive deposits extend across said valleys.

26. An article of manufacture comprising in combination:
a substrate having opposite first and second faces for receiving several first and second electrodes extending in mutual registration on said opposite first and second faces, respectively, said substrate having an edge portion extending between said opposite first and second faces and having spaced first and second bevels extending, respectively, along said opposite first and second faces of the substrate; and
means for electrically interconnecting corresponding first and second electrodes, comprising a plurality of electrically conductive deposits extending across said edge portion onto said first and second bevels and being distributed along said edge portion in a pattern including a recurring deposit width smaller than the smallest spacing between any adjacent two electrodes of either of said first and second electrodes, alternating with a recurring deposit spacing smaller than the smallest width of any of said first and second electrodes.

27. An article of manufacture comprising in combination:
a substrate having an edge portion extending between opposite faces of said substrate and having spaced first and second bevels extending, respectively, along said opposite first and second faces of the substrate;
several first and second electrodes extending in mutual registration on said opposite first and second faces of the substrate and onto said first and second bevels, respectively; and
means for electrically interconnecting corresponding first and second electrodes, comprising a plurality of electrically conductive deposits extending across said edge portion onto said first and second bevels and being distributed along said edge portion in a pattern including a recurring deposit width smaller than the smallest spacing between any adjacent two electrodes of either of said first and second electrodes, alternating with a recurring deposit spacing smaller than the smallest width of any of said first and second electrodes.

28. An article as claimed in claim 26 or 27, wherein:
said edge portion has an indented profile composed of peaks and valleys alternating along said edge portion, with any of said peaks having a width smaller than the smallest spacing between any adjacent two electrodes of either of said first and second electrodes, and any of said valleys having a width smaller than the smallest width of any of said first and second electrodes; and said conductive deposits extend across said peaks and onto said first and second bevels.

29. An article as claimed in claim 22, 23, 26 or 27, wherein:
said substrate comprises electrooptically active light gate material.

30. An article as claimed in claim 29, including:
an antireflective coating on said material.

31. An article as claimed in claim 22, 23, 26 or 27, wherein:
any of said deposits includes a group of mutually spaced electrically conductive deposit elements which extend across said edge portion; and
said group has an overall width equal to said deposit width.

* * * * *